US006781154B2

United States Patent
Gotoh

(10) Patent No.: US 6,781,154 B2
(45) Date of Patent: Aug. 24, 2004

(54) SEMICONDUCTOR APPARATUS

(75) Inventor: Masahito Gotoh, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/385,465

(22) Filed: Mar. 12, 2003

(65) Prior Publication Data

US 2003/0173629 A1 Sep. 18, 2003

(30) Foreign Application Priority Data

Mar. 15, 2002 (JP) ............................ P2002-072406

(51) Int. Cl.[7] .................................................. H01C 29/04
(52) U.S. Cl. .......................... 257/59; 257/72; 349/38; 349/39; 349/48; 349/139; 349/140; 349/141
(58) Field of Search ...................... 257/59, 72; 349/38, 349/39, 48, 139, 140, 141, 42

(56) References Cited

U.S. PATENT DOCUMENTS 6,057,897 A * 5/2000 Ichikawa et al. ............. 349/48
6,633,359 B1 * 10/2003 Zhang et al. ................ 349/141

FOREIGN PATENT DOCUMENTS

JP A 60-66288 4/1985

* cited by examiner

Primary Examiner—Eddie Lee
Assistant Examiner—Thomas Magee
(74) Attorney, Agent, or Firm—Nixon & Vanderhye P.C.

(57) ABSTRACT

An object of the invention is to provide a semiconductor apparatus which simplifies a structure and reduces a possibility of occurrence of manufacture defect. Two of a first TFT and a second TFT which adjoins each other in a first direction are integrated in one semiconductor piece and share a source region electrically connected to a signal line and are formed in a symmetric shape in relation to a reference plane. Two scanning lines which extend in a second direction perpendicular to the first direction and are electrically connected to channel regions of the first and second TFTs and auxiliary capacitor electrodes for forming auxiliary capacitor between the auxiliary capacitor electrodes and drain electrodes electrically connected to the first and second TFTs are symmetrically arranged in relation to the reference plane.

10 Claims, 7 Drawing Sheets

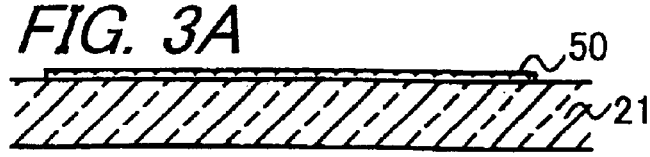
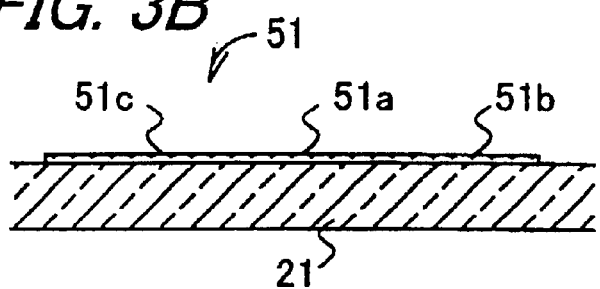
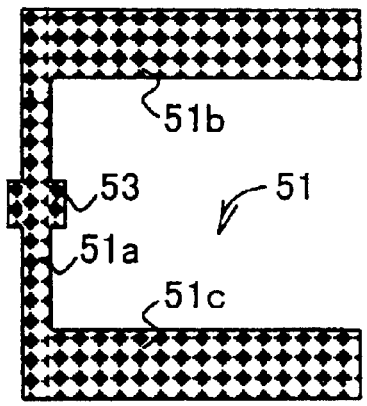
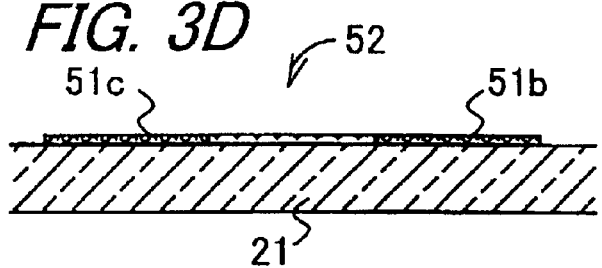
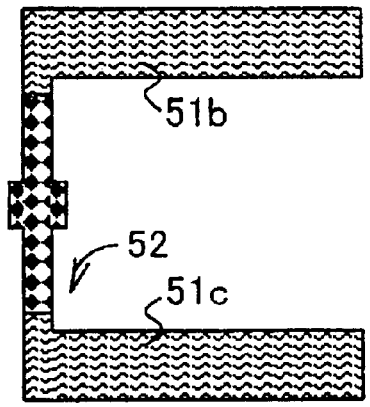
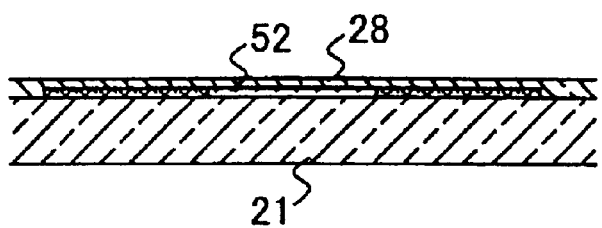
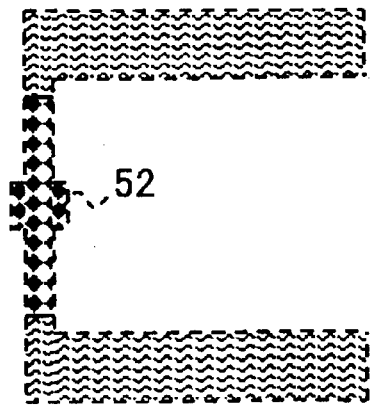

SEMICONDUCTOR APPARATUS

BACKGROUND OF THE INVENTION

1. Field of the Invention

The present invention relates to a semiconductor apparatus, particularly to the structure of a thin film transistor (abbreviated as "TFT") by which liquid crystal of an active matrix display unit is driven.

2. Description of the Related Art

A liquid crystal display unit of an active matrix driving type using a TFT as a driving element included in a thin semiconductor apparatus enabling low power to be consumed has high performance like advanced contrast and high speed response. Consequently, a liquid crystal display unit is mainly used as a display unit of a personal computer or the like or mounted on a portable television receiving apparatus or the like. The scale of the market for such a liquid crystal display unit has largely expanded in recent years.

FIG. 6 is a plan view showing a conventional liquid crystal panel 1. FIG. 7 is a cross sectional view viewed from a cross sectional line VII—VII in FIG. 6. The liquid crystal panel 1 comprises a light transmitting substrate 3, semiconductor pieces 2 each having a source region 4, a channel region 5 and a drain region 6, a gate insulating film 7, scanning lines 8, auxiliary capacitor electrodes 9, a first interlayer insulating film 10, signal lines 11, drain electrodes 12, a second interlayer insulating film 13 and pixel electrodes 14. The channel region 5 of the semiconductor piece 2 is a semiconductor. The source region 4 and the drain region 6 are electrically conductive because of impurity injected into the semiconductor.

Furthermore, signal line contact holes 15, drain electrode contact holes 16 and pixel electrode contact holes 17 are formed in the liquid crystal panel 1. The signal line 11 is electrically connected to the source region 4 of the semiconductor piece 2 via the signal line contact hole 15. Furthermore, the drain electrode 12 is electrically connected to the drain region 6 of the semiconductor piece 2 via the drain electrode contact hole 16. In addition, the pixel electrode 14 is electrically connected to the drain electrode 12 of the semiconductor piece 2 via the pixel electrode contact hole 17. As to such a liquid crystal panel 1, the TFT has a structure at least including the semiconductor piece 2 having the source region 4 electrically connected to the signal line 11, the channel region 5 electrically connected to the scanning line 8 and the drain region 6 electrically connected to the pixel electrode 14.

In such a conventional liquid crystal panel 1, one signal line contact hole 15 is usually formed for one semiconductor piece 2. As an example of a defective of the signal line contact hole 15, there are a resist defective and a so-called opening defective of a contact hole which means that no signal line contact hole 15 is formed in spite of performing etching because of dust contamination during manufacturing. When there is occurrence of opening defective on the opening of the signal line contact hole 15 for some reason, the signal line 11 can not be electrically connected to the source region 4 of the TFT 2, and thereby signal voltage can not be applied to the TFT facing the signal line contact hole with occurrence of the defective. Thereby, the TFT comprising the semiconductor piece 2 can not apply driving voltage from the drain region 4 to the pixel electrode 14 by applying the signal voltage from the signal line 11 to the source region 4 and from the scanning line 8 to the channel region 5.

Such a pixel without capability of liquid crystal driving is called a point defect and is displayed in black or white on a liquid crystal panel. This point defect can be easily recognized by the eyes of human and therefore no point defect should exist on a liquid crystal panel. With existence of any point defect on the liquid crystal panel, the whole of the liquid crystal panel becomes defective and the panel can not be used for a liquid crystal display unit. Accordingly, eliminating point defect is an important countermeasure item leading to quality improvement of a liquid crystal panel and furthermore reduction of production cost of the panel.

SUMMARY OF THE INVENTION

Consequently, an object of the invention is to provide a semiconductor apparatus which simplifies a structure and reduces a possibility of occurrence of manufacture defect.

The invention provides a semiconductor apparatus comprising:
  a plurality of signal lines extending in one direction and arranged substantially in parallel each other;
  a plurality of scanning lines extending in the other direction intersecting in one direction and arranged substantially in parallel each other;
  a plurality of driving electrodes arranged in the form of a matrix; and
  switching elements having a source region electrically connected to the signal line, a channel region electrically connected to the scanning line and a drain region electrically connected to a driving electrode, for applying driving voltage from the drain region to the driving electrode by applying signal voltage from the signal line to the source region and from the scanning line to the channel region, the switching elements being formed so that every two of the plurality of switching elements which are adjoined in one direction are integrated in one semiconductor piece.

According to the invention, two switching elements which are adjoined in one direction are integrated in one semiconductor piece, therefore, a number of semiconductor pieces required for forming a predetermined number of switching elements can be reduced half and the structure of the semiconductor apparatus can be simplified, in comparison with such a conventional semiconductor apparatus that one switching element can be formed for one semiconductor piece. When the semiconductor apparatus is manufactured, it is necessary to manufacture the semiconductor apparatus so that all the switching elements can perform such a predetermined operation that driving voltage is applied from the drain region to the driving electrode by applying signal voltage from the signal line to the source region and from the scanning line to the channel region. For this purpose, all the semiconductor pieces should be formed at least in a predetermined shape when the semiconductor apparatus is manufactured. The less a number of semiconductor pieces to be formed becomes, the easier all the semiconductor pieces can be formed into the predetermined shape. In the semiconductor apparatus according to the invention, therefore, a degree of forming all the semiconductor pieces into the predetermined shape becomes twice in comparison with the conventional semiconductor apparatus. In other words, a degree that all the switching elements can perform the predetermined operation becomes twice. Consequently, the semiconductor apparatus according to the invention can halve a possibility of occurrence of manufacturing failure in comparison with the conventional semiconductor apparatus.

According to the invention, in comparison with such a conventional semiconductor apparatus that one switching element is formed for one semiconductor piece, the structure of the semiconductor apparatus can be simplified and the possibility of occurrence of manufacturing failure can be reduced half.

In addition, in the invention it is preferable that the two switching elements share the source region.

According to the invention, the two switching elements integrated in one semiconductor piece share the source region electrically connected to the signal line. A number of source regions electrically connected to the signal line, therefore, is reduced half and the structure of the semiconductor apparatus can be simplified, in comparison with such a conventional semiconductor apparatus that one switching element can be formed for one semiconductor piece. When the semiconductor apparatus is manufactured, it is necessary to manufacture the semiconductor apparatus so that all the switching elements can perform such a predetermined operation that driving voltage is applied from the drain region to the driving electrode by applying signal voltage from the signal line to the source region and from the scanning line to the channel region. For this purpose, all of the source regions and the signal lines should be at least electrically connected to each other when the semiconductor apparatus is manufactured. The less the number of source regions to be connected to the signal lines becomes, the easier all of the source regions and the signal lines can be electrically connected to each other. In the semiconductor apparatus according to the invention, therefore, a degree that all of the source regions and the signal lines are electrically connected to each other becomes twice in comparison with the conventional semiconductor apparatus. In other words, a degree that all the switching elements can perform the predetermined operation becomes twice. Consequently, the semiconductor apparatus according to the invention can halve a possibility of occurrence of manufacturing failure in comparison with the conventional semiconductor apparatus.

In addition, according to the invention, in comparison with such a conventional semiconductor apparatus that one switching element can be formed for one semiconductor piece, the structure of the semiconductor apparatus according to the invention can be simplified and the possibility of occurrence of manufacturing failure can be certainly reduced half.

In addition, in the invention it is preferable that the two switching elements have a symmetrical shape in relation to the source region.

According to the invention, the two switching elements integrated in one semiconductor piece have the symmetrical shape in relation to the source region. Therefore, the two switching elements can be provided with the same characteristics. When the same signal voltage is applied from the signal line and the scanning line to both the switching elements respectively, the same driving voltage is applied from a drain region of each switching element to the driving electrode. Therefore, a driving object connected to the driving electrode can be uniformly driven for the whole of the semiconductor apparatus.

In addition, according to the invention, the driving object connected to the driving electrode can be uniformly driven for the whole of the semiconductor apparatus.

Additionally, in the invention it is preferable that the two scanning lines electrically connected to the two switching elements are symmetrically arranged in relation to the source region, the drain electrodes for electrically connecting each of the driving electrodes to each of the drain regions of the two switching elements are symmetrically arranged in relation to the source region, and auxiliary capacitor lines for forming each auxiliary capacitor between each of the auxiliary capacitor lines and each of the drain electrodes electrically connected to the two switching elements are symmetrically arranged in relation to the source region.

According to the invention, the two scanning lines which are electrically connected to the two switching elements integrated in one semiconductor piece, the drain electrodes for electrically connecting each of the driving electrodes to each of the drain regions of the two switching elements integrated in one semiconductor piece and the auxiliary capacitor lines for forming auxiliary capacitor between each of the auxiliary capacitor lines and each of the drain electrodes electrically connected to the two switching elements integrated in one semiconductor piece are symmetrically arranged in relation to the source region. Therefore, the two switching elements and the two auxiliary capacities can be certainly provided with the same characteristics. Thereby, when the same signal voltage is applied from any signal line and scanning line to both the switching elements, the same driving voltage is applied from the drain region of each switching element to the driving electrode. A driving object connected to the driving electrode, therefore, can be uniformly driven on the whole of the semiconductor apparatus. In addition, when the same signal voltage is applied from the signal line to the source region and from the scanning line to the channel region, a charge is accumulated in the auxiliary capacitor. Therefore, even when signal voltage is not applied to the switching element, the same voltage as the driving voltage can be applied to the driving electrode by the auxiliary capacitor in which the charge is accumulated.

In addition, according to the invention, the driving object connected to the driving electrode can be uniformly driven on the whole of the semiconductor apparatus and even when signal voltage is not applied to the switching element, the same voltage as the driving voltage retained in the auxiliary capacitor can be applied to the driving electrode.

In addition, in the invention it is preferable that at least a part of each of the channel regions of the two switching elements is located on a position opposite to the signal line in a direction perpendicular to one direction and perpendicular to the other direction.

According to the invention, at least a part of each of channel regions of the two switching elements integrated in one semiconductor piece is arranged on a position opposite to the signal line in the direction perpendicular to one direction and perpendicular to the other direction. For example, when the semiconductor apparatus is used for the liquid crystal display unit, a region in which the signal line is located serves as a light shielding region for shielding light traveling in the direction perpendicular to one direction and perpendicular to the other direction. By locating at least each of the part of the channel regions on the position opposite to the signal line in relation to the light traveling direction, more increase of the light shielding region caused by the channel region is prevented and a predetermined light transmission region can be secured. In addition, since a region in which the channel region is located is included in the region in which the signal line is located, a predetermined auxiliary capacity can be secured without decrease of a region in which the auxiliary capacitor line is located, i.e., an area of the auxiliary capacitor line.

In addition, according to the invention, more increase of the light shielding region caused by the channel region is prevented, and not only the predetermined light transmission region, but also the predetermined auxiliary capacity can be secured in the semiconductor apparatus.

In addition, the invention provides a method of manufacturing a semiconductor apparatus comprising the steps of:

forming a semiconductor layer on a substrate and two drain regions on the semiconductor layer;

forming a gate insulating film on the substrate so as to cover the semiconductor layer;

forming scanning lines and auxiliary capacitor lines on the gate insulating film;

forming one source region between the two drain regions of the semiconductor layer and forming channel regions between the drain regions and the source region of the semiconductor layer;

forming a first interlayer insulating film on the gate insulating film so as to cover the scanning lines and the auxiliary capacitor lines and forming a signal line contact hole facing the source region and drain region contact holes each facing the drain region, the signal line contact hole and the drain region contact holes piercing both the gate insulating film and the first interlayer insulating film in a direction in which each insulating layer is stacked;

forming, on the first interlayer insulating film, a signal line which is connected to the source region via the signal line contact hole and forming drain electrodes each of which is connected to each of the drain regions of the semiconductor layer via each of the drain region contact holes;

forming a second interlayer insulating film on the first interlayer insulating film so as to cover the signal line and the drain electrodes and forming driving electrode contact holes each facing each of the drain electrodes, the each of the driving electrode contact holes piercing the second interlayer insulating film in the direction in which each insulating layer is stacked; and forming, on the second interlayer insulating film, driving electrodes each of which is connected to each of the drain electrodes via each of the driving electrode contact holes.

According to the invention, the semiconductor by which the above-mentioned operation can be achieved can be manufactured.

BRIEF DESCRIPTION OF THE DRAWINGS

Other and further objects, features, and advantages of the invention will be more explicit from the following detailed description taken with reference to the drawings wherein:

FIGS. 3A to 3G are cross sectional views and plan views showing each step of a method of manufacturing the semiconductor apparatus;

DETAILED DESCRIPTION OF THE PREFERRED EMBODIMENTS

Figure 1:
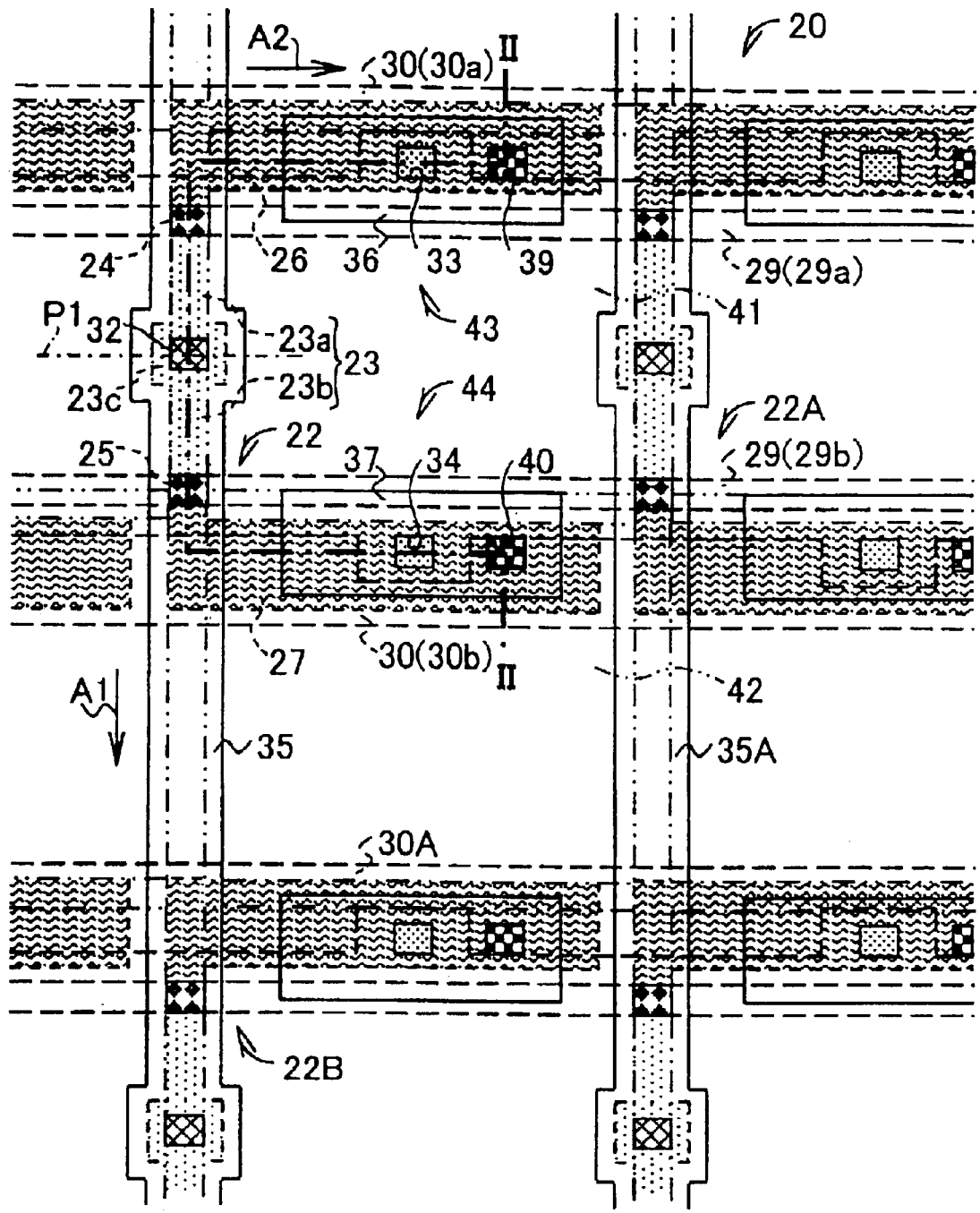
FIG. 1 is a plan view showing a semiconductor apparatus according to one embodiment of the invention.

Now referring to the drawings, preferred embodiments of the invention are described below.

Figure 2:
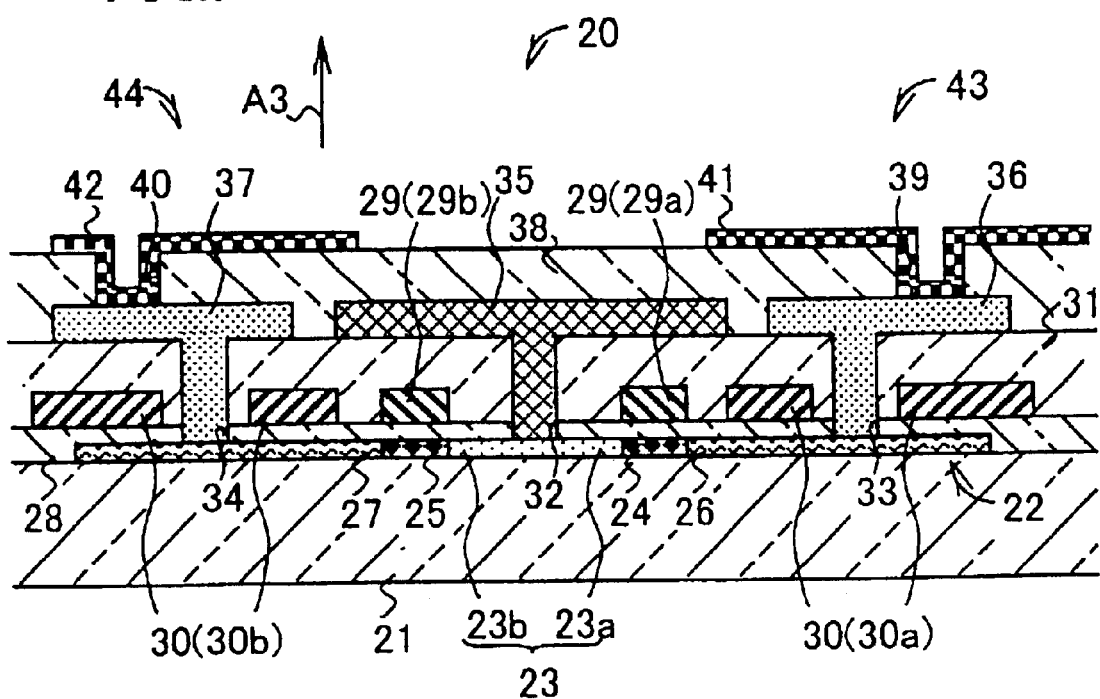
FIG. 2 is a cross sectional view viewed from a cross sectional line II—II in FIG. 1.

FIG. 1 is a plan view showing a semiconductor apparatus 20 according to one embodiment of the invention. FIG. 2 is a cross sectional view viewed from a cross sectional line II—II. FIGS. 1 and 2 are shown with partly changed relative dimensions in order to facilitate understanding. FIG. 2 represents a surface of each film as a flat surface in order to further facilitate understanding, but an actual surface of each film is not a flat surface. A semiconductor apparatus 20 is mounted on a liquid crystal display unit (abbreviated as "LCD") of an active matrix driving type. The semiconductor apparatus 20 has a plurality of TFTs which serve as switching elements for applying a driving voltage to pixel electrodes arranged in the form of a matrix.

In a semiconductor apparatus 20, a plurality of semiconductor pieces 22 in a substantially "C"-shape are formed which are arranged in the form of a matrix on a light transmitting substrate 21 having light transmitting property, e.g., made of quartz glass. In detail, the semiconductor piece 22 comprises a source region 23 extending to a first direction A1 as one direction which is a direction of extension of a signal line 35 to be hereinafter described, a first channel region 24 which communicates with an end portion of the source region 23 on an upstream side of the first direction A1 and extends in the first direction A1, a second channel region 25 which communicates with an end portion of the source region 23 on a downstream side of the first direction A1 and extends in the first direction A1, a first drain region 26 which communicates with an end portion of the first channel region 24 on the upstream side of the first direction A1 and extends in a second direction A2 as the other direction which is a direction of extension of a scanning line 29 to be hereinafter described and perpendicular to the first direction A1, a second drain region 27 which communicates with an end portion of the second channel region 25 on the downstream side of the first direction A1 and extends in the second direction A2.

In addition, the semiconductor piece 22 has a symmetric shape in relation to a reference plane P1 perpendicular to the first direction A1 in relation to the source region 23. In detail, a region which includes a first source region 23a on the upstream side of the first direction A1 in relation to the reference plane P1 which passes through a center of the source region 23 of the semiconductor piece 22 and is perpendicular to the first direction A1, the first channel region 24 and the first drain region 26 and a region which includes a second source region 23b on the downstream side of the first direction A1 in relation to the reference plane P1, the second channel region 25 and the second drain region 27, are symmetric with respect to the reference plane P1. In addition, in the source region 23 of the semiconductor piece 22, a dimension of the center portion 23c in the second direction A2 is larger than that of the residual portion, and the source region 23 has a symmetric shape in relation to the reference plane P1.

The semiconductor piece 22 is made of crystalline silicon on the whole, but the source region 23, the first drain region 26 and the second drain region 27 are electrically conductive because phosphorus ion (chemical formula:P+) as an impurity is injected into the source region 23, the first drain region 26 and the second drain region 27. The first channel region 24 and a second channel region 25 of the semiconductor piece 22 are semiconductors. A thickness of the semiconductor piece 22 is approximately 50 nm in a stacking direction A3 in which insulating films 28, 31 and 38 to be hereinafter described are stacked and which is perpendicular to the first direction A1 and the second direction A2, respectively. The wording "thickness" hereinafter means a thickness in the stacking direction A3.

On the light transmitting substrate 21, a gate insulating film 28 made of silicon oxide is formed so as to cover the semiconductor piece 22. A thickness of the gate insulating film 28 is approximately 80 nm.

On the gate insulating film 28, a plurality of scanning lines 29 are formed which extend in the second direction A2 and are arranged substantially in parallel with each other. Each scanning line 29 is an electrically conductive line in which an N+ polysilicon film and a tungsten silicide film of are stacked by turns and two scanning lines are formed opposite to one semiconductor piece 22 in the stacking direction A3. In detail, one scanning line 29a is formed on a position opposite to the first channel region 24 of the semiconductor piece 22 in relation to the stacking direction A3. The other scanning line 29b is formed on a position opposite to the second channel region 25 of the semiconductor piece 22 in relation to the stacking direction A3. In addition, one scanning line 29a and the other scanning line 29b are arranged so as to be symmetric in relation to the reference plane P1. The N+ polysilicon film is a silicon film containing an n-type impurity such as phosphorus in polysilicon, and a polysilicon film containing high concentration impurity is used as an electrically conductive film.

In addition, on the gate insulating film 28, a plurality of auxiliary capacitor electrodes 30 are formed which extend in the second direction A2 and are arranged substantially in parallel with each other. Each of the auxiliary capacitor electrodes 30 is an electrically conductive electrode in which an N+ polysilicon film and a tungsten silicide film, similar to the scanning lines 29, are stacked by turns and two auxiliary capacitor electrodes 30 are formed opposite to the single semiconductor piece 22 in relation to the stacking direction A3. In detail, one auxiliary capacitor electrode 30a is formed on a position opposite to the first drain region 26 of the semiconductor piece 22 in relation to the stacking direction A3, which position is a position excluding the vicinity of a region in which a first drain electrode contact hole 33 to be hereinafter described is formed. The other auxiliary capacitor electrode 30b is formed on a position opposite to the second drain region 27 of the semiconductor piece 22 in relation to the stacking direction A3, which position is a position excluding the vicinity of a region in which a second drain electrode contact hole 34 to be hereinafter described is formed. In addition, one auxiliary capacitor electrode 30a and the other auxiliary capacitor electrode 30b are arranged so as to be symmetric in relation to the reference plane P1.

One scanning line 29a and one auxiliary capacitor electrode 30a are arranged at a distance in the first direction A1 so as to avoid bringing contact with each other. The other scanning line 29b and the other auxiliary capacitor electrode 30b are arranged at a distance in the first direction A1 so as to avoid bringing contact with each other. A thickness of each scanning line 29 and a thickness of each auxiliary capacitor electrode 30 are approximately 300 nm.

Furthermore, on the gate insulating film 28, a first interlayer insulating film 31 made of silicon oxide is formed so as to cover the scanning lines 29 and the auxiliary capacitor electrodes 30. A thickness of the first interlayer insulating film 31 is approximately 600 nm.

In the first interlayer insulating film 31 and the gate insulating film 28, a signal line contact hole 32 is formed which pierces the first interlayer insulating film 31 and the gate insulating film 28 in the stacking direction A3 and has an opening facing the central portion 23c in the source region 23 of the semiconductor 22. A cross section perpendicular to the stacking direction A3 of a space facing an inside wall of the signal line contact hole 32 has either a square shape or a rectangular shape. An axis line of the signal line contact hole 32 passes through the center of the source region 23 and extends in parallel in the stacking direction A3.

In the first interlayer insulating film 31 and the gate insulating film 28, a first drain contact hole 33 is formed which pierces the first interlayer insulating film 31 and the gate insulating film 28 in the stacking direction A3 and has an opening facing a substantially central portion in the first drain region 26 of the semiconductor 22, and a second drain contact hole 34 is also formed which pierces the first interlayer insulating film 31 and the gate insulating film 28 in the stacking direction A3 and has an opening facing a substantially central portion in the second drain region 27 of the semiconductor 22. A cross section perpendicular to the stacking direction A3 of each space facing inside walls of the first drain contact hole 33 and the second drain contact hole 34 has either a square shape or a rectangular shape.

On the first interlayer insulating film 31, a plurality of signal lines 35 are formed which extend in the first direction A1 and are arranged substantially in parallel with each other. The signal line 35 is also formed on the inside wall of the signal line contact hole 32 and is electrically connected to the source region 23 of the semiconductor 22 via the signal line contact hole 32. The signal line 35 is electrically conductive line in which a Titanium-Tungsten (chemical formula:Ti—W) film having a thickness of 100 nm, an Aluminum-Silicon (chemical formula: Al—Si) film having an a thickness of 400 nm and a Titanium-Tungsten (chemical formula:Ti—W) film having a thickness of 100 nm are stacked in order, and the signal line 35 is located on a position opposite to the first channel region 24 and the second channel region 25 of the semiconductor piece 22 in relation to the stacking direction A3.

In addition, on the first insulating film 31, a first drain electrode 36 is formed on a position opposite to the first drain region 26 and one auxiliary capacitor electrode 30a of the semiconductor piece 22 in relation to the stacking direction A3 and a second drain electrode 37 is formed on a position opposite to the second drain region 27 and the other auxiliary capacitor electrode 30b of the semiconductor piece 22 in relation to the stacking direction A3. The first drain electrode 36 is also formed on the inside wall of the first drain electrode contact hole 33 and is electrically connected to the first drain region 26 of the semiconductor piece 22 via the first drain electrode contact hole 33. The second drain electrode 37 is also formed on the inside wall of the second drain electrode contact hole 34 and is electrically connected to the second drain region 27 of the semiconductor piece 22 via the second drain electrode contact hole 34. The first drain electrode 36 and the second drain electrode 37 are electrically conductive electrodes in which a titanium-tungsten film having a thickness of 100 nm, an aluminum-silicon film having a thickness of 400 nm and a 100 nm titanium-tungsten film having a thickness of 400 nm, similar to the signal line 35, are stacked in order.

In addition, on the first interlayer insulating film 31, a second interlayer insulating film 38 made of silicon oxide is formed so as to cover the signal line 35, the first drain electrode 36 and the second drain electrode 37. A thickness of the second interlayer insulating film 38 is approximately 300 nm.

In the second interlayer insulating film 38, a first pixel electrode contact hole 39 is formed which pierces the second interlayer insulating film 38 in the stacking direction A3 and has an opening facing the first drain electrode 36. In the second interlayer insulating film 38, a second pixel electrode contact hole 40 is also formed which pierces the second insulating film 38 in the stacking direction A3 and has an opening facing the second drain electrode 37. A cross section perpendicular to the stacking direction A3 of each space facing inside walls of the first pixel electrode contact hole 39 and the second pixel electrode contact hole 40 has either a square shape or a rectangular shape.

On the second interlayer insulating film 38, a first pixel electrode 41 is formed so as to cover a region enclosed by one scanning line 29a, the other scanning line 29b and the signal line 35 each opposite to the semiconductor piece 22 in relation to the stacking direction A3, and a signal line 35A opposite to the semiconductor piece 22A, which is adjoined on the downstream side in the second direction A2 of the semiconductor piece 22 and has the same structure as the semiconductor piece 22, in relation to the stacking direction A3. The first pixel electrode 41 is also formed on the inside wall of the first pixel electrode contact hole 39 and is electrically connected to the first drain electrode 36 via the first pixel electrode contact hole 39.

In addition, on the second interlayer insulating film 38, a second pixel electrode 42 as a driving electrode is formed so as to cover a region enclosed by the other auxiliary capacitor electrode 30b and the signal line 35 each opposite to the semiconductor piece 22 in relation to the stacking direction A3, the signal line 35A opposite to the semiconductor piece 22A, which is adjoined on the downstream side of the second direction A2 of the semiconductor piece 22 and has the same structure as the semiconductor piece 22, in relation to the stacking direction A3, and one auxiliary electrode 30A opposite to a semiconductor piece 22B, which is adjoined on the downstream side of the first direction A1 of the semiconductor piece 22 and has the same structure as the semiconductor piece 22, in relation to the stacking direction A3. The second pixel electrode 42 is also formed on the inside wall of the second pixel electrode contact hole 40 and is electrically connected to the second drain electrode 37 via the second pixel electrode contact hole 40. The first pixel electrode 41 and the second pixel electrode 42 as driving electrodes are light-transmitting and electrically-conductive electrodes each of which is made of Indium Tin Oxide (abbreviated as ITO) doped with tin oxide and has a thickness of 100 nm.

As mentioned above, the two thin film transistors composed of a first thin film transistor 43 including at least the first source region 23a, the first channel region 24 and a first drain region 26 and a second thin film transistor 44 including at least the second source region 23b and the second channel region 25 and the second drain region 27, are formed on one semiconductor piece 22. The first thin film transistor 43 opposite to one scanning line 29a in relation to the stacking direction A3 and the second thin film transistor 44 opposite to the other scanning line 29b in relation to the stacking direction A3 share the source region 23 electrically connected to the signal line 35 of the semiconductor piece 22.

One auxiliary capacitor is formed by the first drain electrode 36 electrically connected to the first drain region 26 of the first thin film transistor 43 and one auxiliary capacitor electrode 30a opposite to the first drain electrode 36 in relation to the stacking direction A3. One auxiliary capacitor is electrically connected to the first pixel electrode 41 in parallel. In addition, the other auxiliary capacitor is formed by the second drain electrode 37 electrically connected to the second drain region 27 of the second thin film transistor 44 and the other auxiliary capacitor electrode 30b opposite to the second drain electrode 37 in relation to the stacking direction A3. The other auxiliary capacity is electrically connected to the second pixel electrode 42 in parallel.

Thus, the semiconductor apparatus 20 has a plurality of sets of the first thin film transistor 43 and the second thin film transistor 44 which are arranged in the form of a matrix in the direction A1 and the direction A2 respectively. Consequently, in the semiconductor apparatus 20, one signal line contact hole 32 is formed per two thin film transistors.

Consequently, the first thin film transistor 43 has the first source region 23a electrically connected to a (2i-1)th signal line 35 in the second direction A2, a first channel region 24 electrically connected to a (2k-1)th scanning line 29a in the first direction A1 and the first drain region 26 electrically connected to the first pixel electrode 41 located on a (2i-1)th position in the second direction and a (2k-1)th position in the first direction via the first drain electrode 36. The first thin film transistor 43 applies driving voltage from the first drain region 26 to the first pixel electrode 41 by applying signal voltage from the signal line 35 to the first source region 22a and from the scanning line 29a to the first channel region 24. Wherein, "i" and "k" are a natural number.

In addition, the second thin film transistor 44 has the second source region 23b electrically connected to the (2i-1)th signal line 35 in the second direction A2 and the second channel region 25 electrically connected to a (2k)th scanning line 29b in the first direction A1 and the second drain region 27 electrically connected to the second pixel electrode 42 located on the (2i-1)th position in the second direction and a (2k)th position in the first direction via the second drain electrode 37. The second thin film transistor 44 applies driving voltage from the second drain region 27 to the second pixel electrode 42 by applying signal voltage from the signal line 35 to the second source region 22b and from the scanning line 29b to the second channel region 25.

According to the semiconductor apparatus 20 according to the embodiment of the invention as mentioned above, the two transistors composed of the first thin film transistor 43 and the second thin film transistor 44 adjoining each other in the first direction A1, are integrated in one semiconductor piece 22. Therefore, a number of semiconductor pieces required for forming a predetermined number of transistors can be reduced half and the structure of the semiconductor apparatus can be simplified, in comparison with such a conventional semiconductor apparatus that one transistor is formed for one semiconductor piece. When the semiconductor apparatus is manufactured, it is necessary to manufacture the semiconductor apparatus so that all the transistors can perform such a predetermined operation that driving voltage is applied from the drain region to the driving electrode by applying signal voltage from the signal line to the source region and from the scanning line to the channel region. For this purpose, all the semiconductor pieces should be at least formed to a predetermined shape when the semiconductor apparatus is manufactured. The less a number of semiconductor pieces to be formed becomes, the easier all the semiconductor pieces can be formed into the predetermined shape. Therefore, in the semiconductor apparatus 20 according to the embodiment of the invention, a degree of forming all the semiconductor pieces 22 into the predetermined shape becomes twice in comparison with the conventional semiconductor apparatus. In other words, a degree that all the first thin film transistor 43 and the second thin film transistor 44 can perform the predetermined operation becomes twice.

In addition, the two thin film transistors 43 and 44 integrated in one semiconductor piece 22 share the source region 23 electrically connected to the signal line 35. Therefore, a number of source regions electrically connected to the signal line and a number of signal line contact holes required for such a connection can be reduced half and the structure of the semiconductor apparatus can be simplified, in comparison with such a conventional semiconductor apparatus that one transistor is formed for one semiconductor piece.

When the semiconductor apparatus is manufactured, it is necessary to manufacture the semiconductor apparatus so that all transistors can perform such a predetermined operation that driving voltage is applied from the drain region to the driving electrode by applying signal voltage from the signal line to the source region and from the scanning line to the channel region. For this purpose, when the semiconductor apparatus is manufactured, all the signal line contact holes should certainly pierce the first interlayer insulating film and the gate insulating film in stacking direction A3 at the time of forming the signal line contact holes and the signal line should be electrically connected to the source region via all the signal line contact holes at the time of forming the signal line. The less a number of source regions to be connected and a number of signal line contact holes become, the easier all the source regions and the signal lines can be electrically connected to each other. Therefore, in the semiconductor apparatus 20 according to the embodiment of the invention, a degree that all the source regions 23 and the signal line 35 are electrically connected to each other becomes twice. In other words, a degree that all the first thin film transistors 43 and the second thin film transistors 44 can perform the predetermined operation becomes twice. Consequently, the semiconductor apparatus 20 according to the embodiment of the invention can halve a possibility of occurrence of manufacturing failure in comparison with the conventional semiconductor apparatus.

In addition, according to the semiconductor apparatus 20 according to the embodiment of the invention, the two thin film transistors 43 and 44 integrated in one semiconductor piece 22 have the symmetrical shape in relation to the source region 23. Therefore, the first thin film transistor 43 and the second thin film transistor 44 can be provided the same characteristics. When signal voltage applied from the signal line 35 to the source region 23 (the first source region 23*a*) and from the scanning line 29*a* to the first channel region 24 in the first thin film transistor 43 is the same as signal voltage applied from the signal line 35 to the source region 23 (the second source region 23*b*) and from the scanning line 29*b* to the second channel region 25 in the second thin film transistor 44, the same driving voltage is applied from the drain region 26 to the pixel electrode 41 and from the drain region 27 to the pixel electrode 42. Therefore, a driving object, which is a liquid crystal in the embodiment of the invention, connected to each of the pixel electrodes 41 and 42 can be uniformly driven for the whole of the semiconductor apparatus 20.

In addition, according to the semiconductor apparatus 20 according to the embodiment of the invention, the two scanning lines 29*a* and 29*b* electrically connected to the two thin film transistors 43 and 44 integrated in one semiconductor piece 22, the first drain electrode 36 and the second drain electrode 37 used for electrically connecting the first pixel electrode 41 and the second pixel electrode 42 to the first drain region 26 and the second drain region 27 of the two thin film transistors 43 and 44 integrated in one semiconductor piece 22, and the auxiliary capacitor electrodes 30*a* and 30*b* for forming each auxiliary capacitor between each of the auxiliary capacitor electrodes 30*a* and 30*b* and each of the first drain electrode 36 and the second drain electrode 37 electrically connected to the two thin film transistors 43 and 44 integrated in one semiconductor piece 22, are symmetrically arranged in relation to the source region 23. Therefore, in each of thin film transistors 43 and 44, characteristics of parasitic capacitors formed between the scanning lines 29*a* and 29*b* and the drain electrodes 36 and 37 can be made the same as characteristics of the auxiliary capacitors.

Thereby, when the same signal voltage is applied from any signal line 35 and any scanning line 29 to the thin film transistors 43 and 44, the same driving voltage is applied from each of the drain regions 26 and 27 of each of the thin film transistors 43 and 44 to each of the pixel electrodes 41 and 42. Therefore, a driving object connected to each of the pixel electrodes 41 and 42 can be uniformly driven in relation to the whole of the semiconductor apparatus 20. In addition, when signal voltage applied from the signal line 35 to the source region 23 (the first source region 23*a*) and from the scanning line 29*a* to the first channel region 24 in relation to the first thin film transistor 43 is the same as signal voltage applied from the signal line 35 to a source region 23 (the second source region 23*b*) and from scanning line 29*b* to the second channel region 25 in relation to the second thin film transistor 44, the same charge is accumulated in each auxiliary capacitor. Therefore, even when signal voltage is not applied to the thin film transistors 43 and 44, the same driving voltage can be applied to each of the pixel electrodes 41 and 42 by each auxiliary capacitor in which the charge is accumulated.

In addition, according to the semiconductor apparatus 20 according to the embodiment of the invention, at least a part of each of the channel regions 24 and 25 of the two thin transistors 43 and 44 integrated in one semiconductor piece 22 is located on a position opposite to the signal line 35 in the stacking direction A3 perpendicular to the first direction A1 and perpendicular to the second direction A2. When the semiconductor apparatus 20 is used for a liquid crystal display unit, a region in which the signal line 35 is located serves as a light shielding region for shielding light traveling in the stacking direction A3. By locating at least each of the part of each of the channel regions 24 and 25 on the position opposite to the signal line 35 in relation to the light traveling direction, more increase of the light shielding region caused by each of the channel regions 24 and 25 is prevented and a predetermined light transmission region can be secured. In addition, since a region in which each of the channel regions 24 and 25 is located is included in the region in which the signal line 35 is located, a predetermined auxiliary capacity can be secured without decrease of a region in which each of the auxiliary capacitor electrodes 30*a* and 30*b* is located, i.e., an area of each of the auxiliary capacitor electrodes 30*a* and 30*b*.

In the embodiment of the invention, the first interlayer insulating film 31 and the second interlayer insulating film 38 are made of silicon oxide, however, the interlayer insulating films may be made of a silicon nitride film, a silicon nitride oxide film, or a composite film of silicon nitride and silicon nitride oxide. In the embodiment of the invention, the semiconductor apparatus 20 may be used for various apparatuses using a thin film transistor, e.g., the liquid crystal display unit.

FIGS. 3A to 3G, 4A to 4F and 5A to 5F are cross sectional views and plan views showing each step of a method of manufacturing the semiconductor apparatus 20.

FIG. 3A is a cross sectional view showing a first step of the method of manufacturing the semiconductor apparatus 20. At the first step, amorphous silicon is deposited on the light transmitting substrate 21 so as to have a thickness of approximately 50 nm, for instance, by performing chemical vapor deposition (abbreviated as "CVD") method and this amorphous silicon is crystallized to form a crystallized silicon film 50. Methods of crystallizing an amorphous silicon film include a method of heating an amorphous silicon film at a temperature of 600° C. or more and a method of irradiation of excimer laser.

FIG. 3B is a cross sectional view showing a second step of a method of manufacturing the semiconductor apparatus 20. FIG. 3C is a plan view showing the second step. Subsequently, at the second step, photolithography method and dry etching are applied to the crystallized silicon film 50 formed at the first step, and the silicon film 50 is patterned so that the patterned silicon film 50 can become a predetermined shape, in the concrete, a first C-shaped piece 51 as the semiconductor layer in a substantially C-shape, as shown in FIG. 3C. In this case, the first C-shaped piece 51 has a first region 51a extending in the first direction A1, a second region 51b extending from an end portion on the upstream side of the first direction A1 of the first region 51a toward the second direction A2 and a third region 51c extending from an end portion on the downstream side of the first direction A1 of the first region 51a toward the second direction A2. These first to third regions 51a to 51c are continuously situated and are formed into one island shape symmetrically in relation to the first region 51a.

In addition, the central portion 53 in the first region 51a, which becomes the central portion 23c (see FIG. 1) in the source region 23 of the semiconductor piece 22 at a sixth step to be hereinafter described, has a larger dimension in the second direction A2 than that of the residual portion of the first area 51a in the second direction A2 and the central portion 53 is formed symmetrically in relation to the reference plane P1. Thus, by forming the central portion 53 of the first region, when the signal line contact hole 32 is formed at a seventh step to be hereinafter described, the signal line contact hole 32 can certainly have an opening facing the source region 23 of the semiconductor piece 22 even in the event that a position of the signal line contact hole 32 is slightly shifted in the second direction A2. The symmetry in relation to the reference plane P1 is secured even in the event that the position of the signal line contact hole 32 is slightly shifted in the second direction A2. Therefore, the positioning of the first direction A1 of the signal line contact hole 32 is even carried out with high accuracy in order to secure the symmetry in relation to the reference plane P1. Consequently, the signal line contact hole 32 can be easily formed at the seventh step.

FIG. 3D is a cross sectional view showing a third step of the method of manufacturing the semiconductor apparatus 20. FIG. 3E is a plan view showing the third step. Subsequently, at the third step, with use of a general method of photolithography, the second region 51b and the third region 51c of the first C-shaped piece 51, which is opposite to the auxiliary capacitor electrode 30 to be formed at a fifth step to be hereinafter described in the stacking direction A3, are exposed from a photoresist and phosphorus ion as impurity is injected into these regions 51b and 51c at a pressure of approximately 3×10$^{15}$ [atoms/cm$^2$] and a second C-shaped piece 52 is formed. Thereby, the second and third regions 51b and 51c are electrically conductive. When phosphorus ion is injected into the first C-shaped piece 51 at this step, regions which become the first channel region 24 and the second channel region 25 of the semiconductor piece 22 later must be surely covered with a photoresist.

FIG. 3F is a cross sectional view showing a fourth step of the method of manufacturing the semiconductor apparatus 20. FIG. 3G is a plan view showing the fourth step. Subsequently, at the fourth step, the photoresist which was used for injection of phosphorus ion at the third step are eliminated and then, for instance, silicon oxide is deposited on the light transmitting substrate 21 by a thickness of approximately 80 nm by performing CVD method so as to cover the semiconductor piece 22 with the silicon oxide and the gate insulating film 28 is formed. And then, the gate insulating film 28 is annealed in atmosphere including oxygen at a temperature of 1050° C. for three minutes to enhance quality of the gate insulating film 28.

Figure 4A:
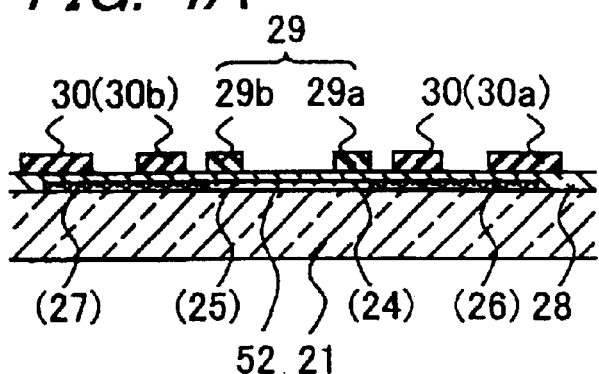
FIGS. 4A to 4F are cross sectional views and plan views showing each step of the method of manufacturing the semiconductor apparatus.
Figure 4B:
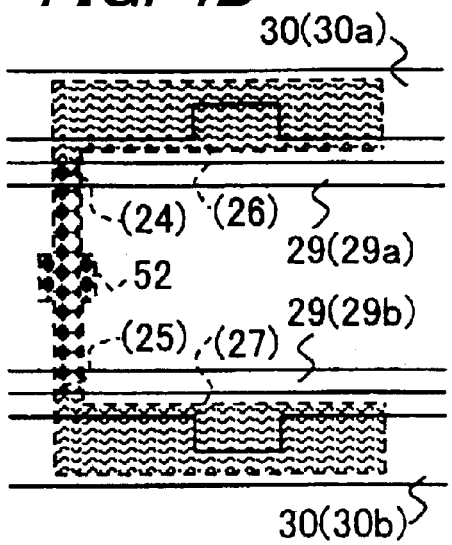

FIG. 4A is a cross sectional view showing a fifth step of the method of manufacturing the semiconductor apparatus 20. FIG. 4B is a plan view showing the fifth step. Subsequently, at the fifth step, the N+ polysilicon film and the tungsten silicide film are stacked by turns on the gate insulating film 28, for instance, by a vacuum deposition method, and general methods of photolithography and dry etching are applied to the stacked films, and the plurality of scanning lines 29 which extend in the second direction A2 and are arranged substantially in parallel with each other, and the plurality of auxiliary capacitor electrodes 30 which extend in the second direction A2 and are arranged substantially in parallel with each other, are formed so that two scanning lines 29 and two auxiliary capacitor electrodes 30 are located on a position opposite to one second C-shaped piece 52 in relation to the stacking direction A3, respectively.

One scanning line 29a of the two scanning lines 29 opposite to one second C-shaped piece 52 in relation to the stacking direction A3 is located at a distance in the first direction A1 from one auxiliary capacitor electrode 30a of the two auxiliary capacitor electrodes 30 opposite to one second C-shaped piece 52 in relation to the stacking direction A3 so as to avoid bring into contact with each other. In addition, the other scanning line 29b of the two scanning lines 29 opposite to one second C-shape piece 52 in relation to the stacking direction A3 is located at a distance in the first direction A1 from the other auxiliary capacitor electrode 30b of the two auxiliary capacitor electrodes 30 opposite to one second C-shaped piece 52 in relation to the stacking direction A3 so as to avoid bring into contact with each other.

One scanning line 29a is formed so as to be opposite to a region which becomes the first channel region 24 of the semiconductor piece 22 at a sixth step to be hereinafter described, in relation to the stacking direction A3. In addition, the other scanning line 29b is formed so as to be opposite to a region which becomes the second channel region 25 of the semiconductor piece 22 at the sixth step to be hereinafter described, in relation to the stacking direction A3. Further, one scanning line 29a and the other scanning line 29b are formed so as to be symmetric in relation to the reference plane P1 at the sixth step to be hereinafter described.

In addition, one auxiliary capacitor electrode 30a is formed so as to be opposite to a region which becomes the first drain region 26 of the semiconductor piece 22 at the sixth step to be hereinafter described, in relation to the stacking direction A3 and so as to exclude the vicinity of a region in which the first drain electrode contact hole 33 at a seventh step to be hereinafter described is formed. In addition, the other auxiliary capacitor electrode 30b is formed so as to be opposite to a region which becomes the first drain region 27 of the semiconductor piece 22 at the seventh step to be hereinafter described, in relation to the stacking direction A3 and so as to exclude the vicinity of a region in which the first drain electrode contact hole 34 at the seventh step to be hereinafter described is formed. In addition, one auxiliary capacitor electrode 30a and the other auxiliary capacitor electrode 30b are formed so as to be symmetric in relation to the reference plane P1.

By forming auxiliary capacitor electrode 30 as mentioned above, when the first drain electrode contact hole 33 and the second drain electrode contact hole 34 are formed by etching at the seventh step to be hereinafter described, the auxiliary capacitor electrode 30 prevents each of drain electrode contact holes 33 and 34 from being not formed in a predetermined shape, thus each of drain electrode contact holes 33 and 34 can be certainly formed. In addition, the auxiliary capacitor electrode 30 is formed so as to exclude only the vicinity of the regions in which each of drain electrode contact holes 33 and 34 is formed. Therefore, unnecessary reduction of the area of the auxiliary capacitor electrode 30 is prevented and an auxiliary capacity formed between the auxiliary capacitor electrode 30 and each of the drain electrode contact holes 33 and 34 can be set to a predetermined capacity.

Figure 4C:
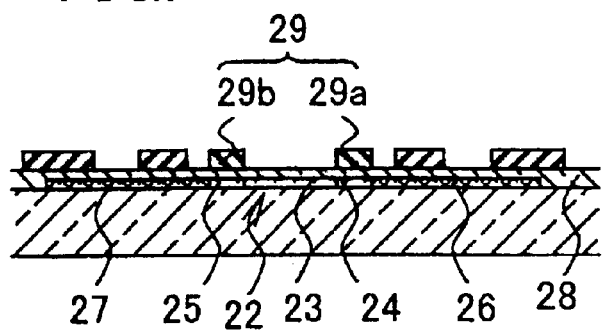
Figure 4D:
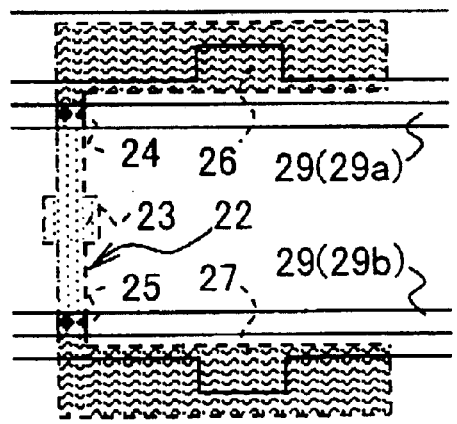

FIG. 4C is a cross sectional view showing a sixth step of the method of manufacturing the semiconductor apparatus 20. FIG. 4D is a plan view showing the sixth step. Subsequently, at the sixth step, phosphorus ion is injected into the second C-shaped piece 52 at a pressure of approximately $3 \times 10^{15}$ [atoms/cm$^2$] by using each of the scanning lines 29 as a mask and the semiconductor piece 22 is formed. By using each of the scanning line 29 as a mask, phosphorus ion is not injected into the first channel region 24 and the second channel region 25 which are opposite to the scanning electrode 29 in relation to the stacking direction A3. The semiconductor piece 22 formed as mentioned above comprises the first and the second channel regions 24 and 25 each of which is located at a position opposite to each of the scanning lines 29 in relation to the stacking direction A3, the source region 23 into which impurity is injected, and the first and second drain regions 26 and 27.

Figure 4E:
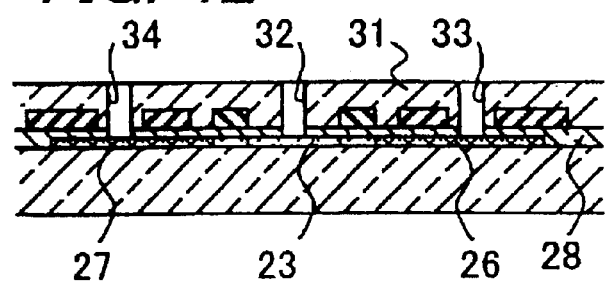
Figure 4F:
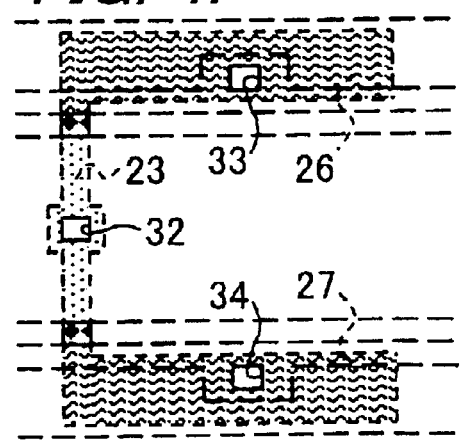

FIG. 4E is a cross sectional view showing a seventh step of the method of manufacturing the semiconductor apparatus 20. FIG. 4F is a plan view showing the seventh step. Subsequently, at the seventh step, a silicon oxide film is deposited until a thickness of 600 nm is reached, for instance, by performing CVD method and the first interlayer insulating film 31 is formed. And heat treatment is performed for 30 minutes in nitrogen atmosphere at a temperature of 950° C. to activate phosphorus ion injected into the source region 23 and the first and second drain regions 26 and 27 of the semiconductor piece 22. And general methods of photolithography, wet etching and dry etching are applied to the gate insulating film 28 and the first interlayer insulating film 31 so as to form the signal line contact hole 32 which pierces the gate insulating film 28 and the first interlayer insulating film 31 in the stacking direction A3 and has an opening facing the central portion 23c in the source region 23 of the semiconductor 22 and so as to furthermore form the first drain electrode contact hole 33 which pierces the first interlayer insulating film 31 and the gate insulating film 28 in the stacking direction A3 and has an opening facing a substantially central portion in the first drain region 26 of the semiconductor piece 22 and so as to also form the second drain electrode contact hole 34 which pierces the first interlayer insulating film 31 and the gate insulating film 28 in the stacking direction A3 and has an opening facing a substantially central portion in the second drain region 27 of the semiconductor piece 22.

Figure 5A:
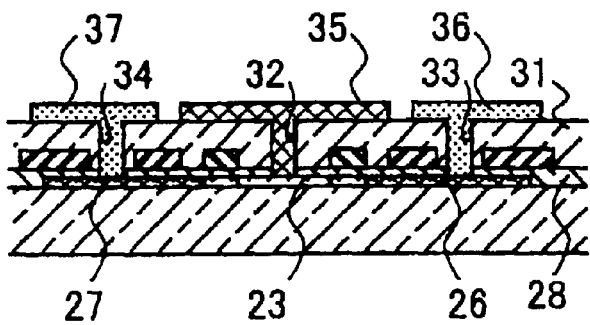
FIGS. 5A to 5F are cross sectional views and plan views showing each step of the method of manufacturing the semiconductor apparatus.
Figure 5B:
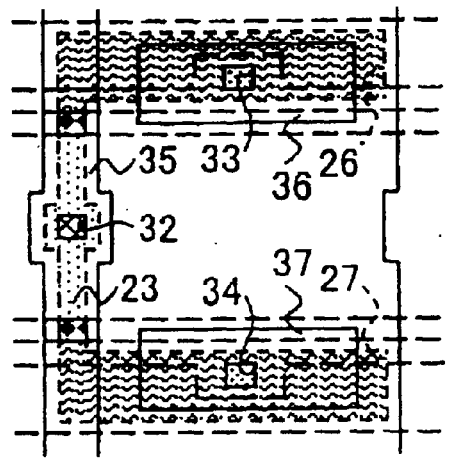

FIG. 5A is a cross sectional view showing an eighth step of the method of manufacturing the semiconductor apparatus 20. FIG. 5B is a plan view showing the eighth step. Subsequently, at the eighth step, a titanium-tungsten film having a thickness of 100 nm, an aluminum-silicon film having a thickness of 400 nm and a titanium-tungsten film having a thickness of 100 nm are stacked by turns on the first interlayer insulating film 31 and the inside wall of the signal line contact hole 32 and inside walls of first and second drain electrode contact holes 33 and 34 for instance by vacuum deposition method. And general methods of photolithography and dry etching are applied to the stacked films so as to form the plurality of signal lines 19 which extend in the first direction A1 in parallel with the second direction A2 and are located opposite to the first and second channel regions 24 and 25 of the semiconductor piece 22 in relation to the stacking direction A3, the first drain electrode 36 which is located opposite to the first drain region 26 and one auxiliary capacitor electrode 30a of the semiconductor piece 22 in relation to the stacking direction A3, and the second drain electrode 37 which is located opposite to the second drain region 27 and the other auxiliary capacitor electrode 30b of the semiconductor piece 22 in relation to the stacking direction A3. The signal line 35 is electrically connected to the source region 23 of the semiconductor piece 22, the first drain electrode 36 is electrically connected to the first drain region 26 of the semiconductor piece 22 and the second electrode 37 is electrically connected to the second drain region 27 of the semiconductor piece 22.

Figure 5C:
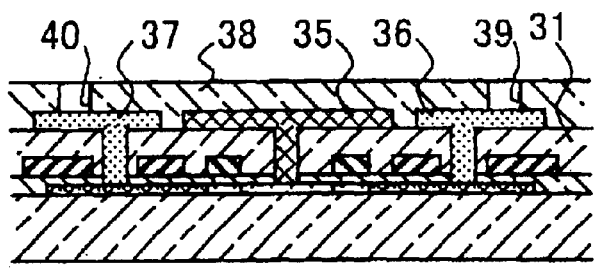
Figure 5D:
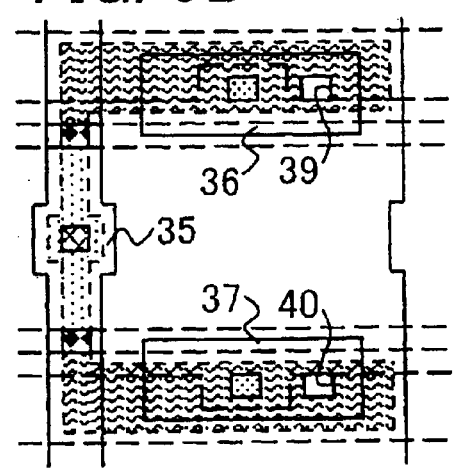

FIG. 5C is a cross sectional view showing a ninth step of the method of manufacturing the semiconductor apparatus 20. FIG. 5D is a plan view showing the ninth step. Subsequently, at the ninth step, a silicon oxide film is deposited until a thickness of approximately 300 nm is reached, for instance, by performing CVD method and the second interlayer insulating film 38 is formed, and general methods of photolithography, wet etching and dry etching are applied to the second interlayer insulating film 38 so as to form the first pixel electrode contact hole 39 which pierces the second interlayer insulating film 38 in the stacking direction A3 and has an opening facing the first drain electrode 36 and form the second pixel electrode contact hole 40 which pierces the second interlayer insulating film 38 in the stacking direction A3 and has an opening facing the second drain electrode 37.

Figure 5E:
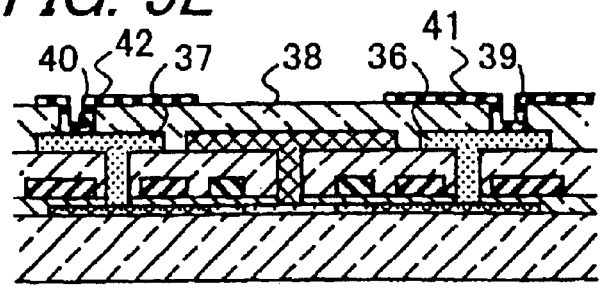
Figure 5F:
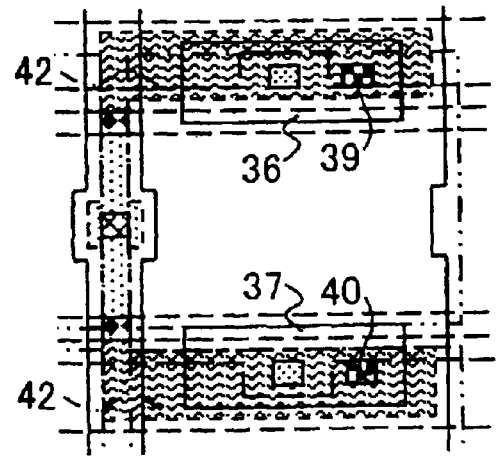
Figure 6:
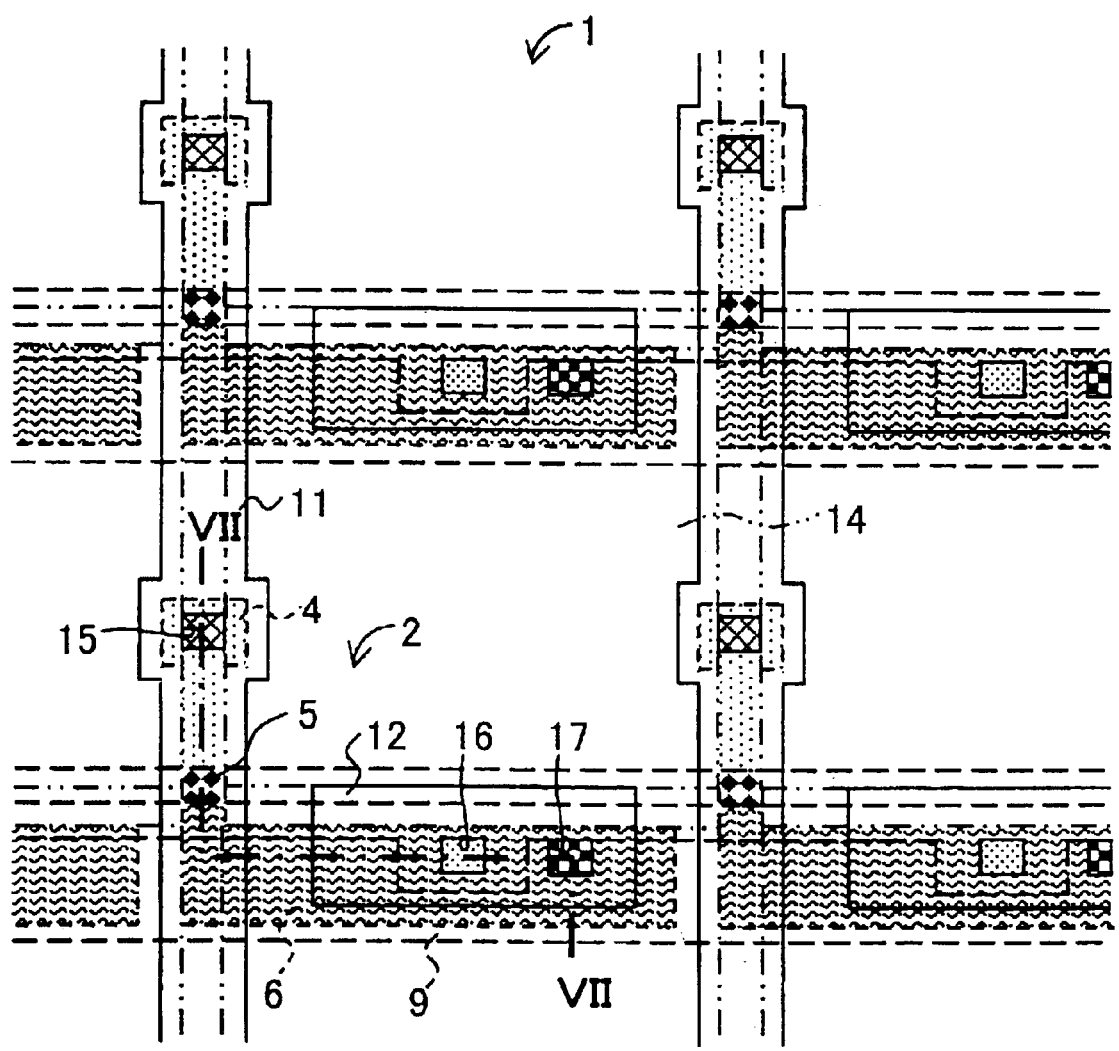
FIG. 6 is a plan view showing a conventional liquid crystal panel.
Figure 7:
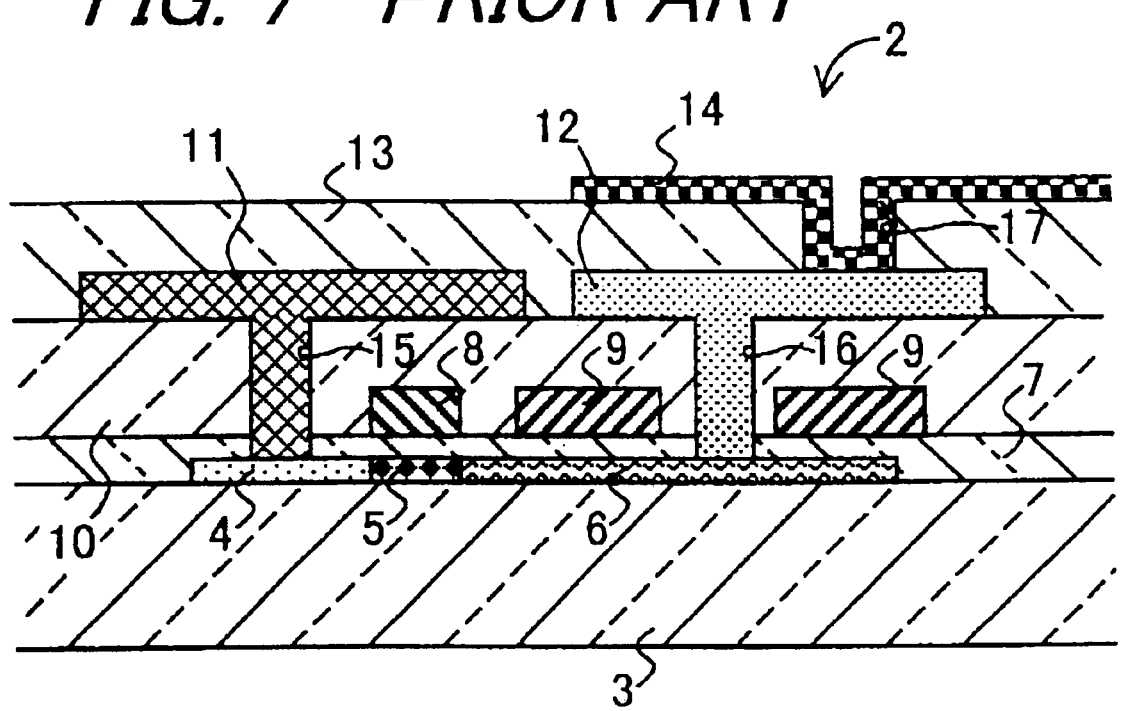
FIG. 7 is a cross sectional view viewed from a cross sectional line VII—VII in FIG. 6.

FIG. 5E is a cross sectional view showing a tenth step of the method of manufacturing the semiconductor apparatus 20. FIG. 5F is a plan view showing the tenth step. Subsequently, at the tenth step, ITO is deposited on the second interlayer insulating film 38 and on the inside walls of the first pixel electrode contact hole 39 and the second pixel electrode contact hole 40 until a thickness of 100 nm is reached, for instance, by performing vacuum deposition method. And then, general methods of photolithography, wet etching and dry etching are applied to the stacked ITO so as to form the first pixel electrode 41 to cover a region enclosed by at least one scanning line 39a, the other scanning line 39b and the signal line 35 above the semiconductor piece 22, and the signal line 35A above the similar semiconductor piece 22A adjoining the downstream side of the second direction A2 of the semiconductor piece 22.

In addition, at the same time, with use of general methods of photolithography, wet etching and dry etching, the second pixel electrode 42 is formed on the second interlayer insulating film 38 to cover a region enclosed by at least the other auxiliary capacitor electrode 30b and the signal line 35 above the semiconductor piece 22, the signal line 35A above the similar semiconductor piece 22A adjoining the downstream side of the second direction A2 of the semiconductor piece 22, and one auxiliary capacitor electrode 30A above the similar semiconductor piece 22B adjoining the downstream side of the first direction A1 of the semiconductor piece 22. The first pixel electrode 41 is electrically connected to the first drain electrode 36 and the second pixel electrode 42 is electrically connected to the second drain electrode 37. The semiconductor apparatus 20 which enables the above-mentioned operation and effect to be achieved can be manufactured by the above-mentioned manufacturing method.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A semiconductor apparatus comprising:

a plurality of signal lines extending in a first direction and arranged substantially in parallel each other;

a plurality of scanning lines extending in a second direction crossing the first direction and arranged substantially in parallel with each other, each of the signals lines and the scanning lines being supported by a non-conductive substrate and being located over the substrate;

a plurality of driving electrodes arranged in the form of a matrix; and a first switching element electrically connected to a first driving electrode for a first pixel, and a second switching element electrically connected to a second driving electrode for a second pixel, wherein each of the first and second switching elements comprise a source region electrically connected to a signal line, a channel region and a drain region electrically connected to the corresponding driving electrode, wherein the first switching element for the first pixel and the second switching element for the second pixel each share a common semiconductor layer that extends continuously therebetween and is supported by the substrate and is located thereover, wherein the common semiconductor layer shared by the first and second switching elements forms at least the channel region of each of the first and second switching elements.

2. The semiconductor apparatus of claim 1, wherein the first and second switching elements share the source region, so that the common semiconductor layer shared by the first and second switching elements forms the source region of each of the first and second switching elements.

3. The semiconductor apparatus of claim 1, wherein the first and second switching elements have a symmetrical shape in relation to the source region shared by the first and second switching elements.

4. The semiconductor apparatus of claim 3, wherein two scanning lines electrically connected to the first and second switching elements respectively are symmetrically arranged in relation to the source region, the drain electrodes for electrically connecting each of the driving electrodes to each of the drain regions of the switching elements are symmetrically arranged in relation to the source region, and auxiliary capacitor lines for forming each auxiliary capacitor between each of auxiliary capacitor lines and each of the drain electrodes electrically connected to the switching elements are symmetrically arranged in relation to the source region.

5. The semiconductor apparatus of claim 1, wherein at least a part of each of the channel regions of the first and second switching elements is located on a position overlapped by the corresponding signal line.

6. A method of manufacturing a semiconductor apparatus comprising:

forming a continuous semiconductor layer on a substrate and two drain regions on the semiconductor layer;

forming a gate insulating film on the substrate so as to cover the semiconductor layer;

forming scanning lines and auxiliary capacitor lines on the gate insulating film;

forming one source region between the two drain regions of the semiconductor layer and forming channel regions between the drain regions and the source region of the semiconductor layer, so that the source region, the two drain regions and the channel regions are all formed in the same continuous semiconductor layer;

forming a first interlayer insulating film on the gate insulating film so as to cover the scanning lines and the auxiliary capacitor lines and forming a signal line contact hole facing the source region and drain region contact holes each facing the drain region, the signal line contact hole and the drain region contact holes piercing both the gate insulating film and the first interlayer insulating film in a direction in which each insulating layer is stacked;

forming, on the first interlayer insulating film, a signal line which is connected to the source region via the signal line contact hole and forming drain electrodes each of which is connected to each of the drain regions of the semiconductor layer via each of the drain region contact holes;

forming a second interlayer insulating film on the first interlayer insulating film so as to cover the signal line and the drain electrodes and forming driving electrode contact holes each facing each of the drain electrodes, the each of the driving electrode contact holes piercing the second interlayer insulating film in the direction in which each insulating layer is stacked;

forming, on the second interlayer insulating film, driving electrodes each of which is connected to each of the drain electrodes via each of the driving electrode contact holes; and wherein the continuous semiconductor layer does not extend across an entire display area of the apparatus but is shared by first and second switching elements for first and second respective pixels, and said continuous semiconductor layer forms at least the channel region of each of the first and second switching elements.

7. The semiconductor apparatus of claim 1, wherein the common semiconductor layer is substantially C-shaped when viewed from above.

8. The semiconductor apparatus of claim 1, wherein the common semiconductor layer is continuous between and is overlapped by at least first and second scanning lines.

9. The semiconductor apparatus of claim 8, wherein the common semiconductor layer is also overlapped by one of the signal lines.

10. The semiconductor apparatus of claim 1, wherein the driving electrodes are pixel electrodes of a liquid crystal display, and wherein the semiconductor apparatus comprises the liquid crystal display.

* * * * *